US010481181B2

(12) United States Patent
Bussing et al.

(10) Patent No.: US 10,481,181 B2
(45) Date of Patent: Nov. 19, 2019

(54) SYSTEMS AND METHODS FOR CURRENT SENSING

(71) Applicant: Allegro MicroSystems, LLC, Manchester, NH (US)

(72) Inventors: Wade Bussing, Manchester, NH (US); Alexander Latham, Harvard, MA (US); Shaun D. Milano, Dunbarton, NH (US); Christian Feucht, Annecy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 77 days.

(21) Appl. No.: 15/496,152

(22) Filed: Apr. 25, 2017

(65) Prior Publication Data

US 2018/0306843 A1 Oct. 25, 2018

(51) Int. Cl.
*G01R 15/20* (2006.01)
*H01L 23/495* (2006.01)
*G01R 33/00* (2006.01)

(52) U.S. Cl.
CPC .................................. *G01R 15/207* (2013.01)

(58) Field of Classification Search
CPC ... G01R 15/207; G01R 15/202; G01R 15/205
See application file for complete search history.

(56) References Cited

U.S. PATENT DOCUMENTS

| 6,356,068 | B1 | 3/2002 | Steiner et al. |
| 6,995,315 | B2 | 2/2006 | Sharma et al. |
| 7,075,287 | B1 | 7/2006 | Mangtani et al. |
| 7,166,807 | B2 | 1/2007 | Gagnon et al. |
| 7,259,545 | B2 | 8/2007 | Stauth et al. |
| 7,476,816 | B2 | 1/2009 | Doogue et al. |
| 7,518,354 | B2 | 4/2009 | Stauth et al. |

(Continued)

OTHER PUBLICATIONS

Allegro Datasheet ACS724 "Automotive-Grade, Galvanically Isolated Current Sensor IC With Common-Mode Field Rejection in a Small-Footprint SOIC8 Package", Dec. 13, 2018, 33 pages.

(Continued)

*Primary Examiner* — Christopher P McAndrew
*Assistant Examiner* — Zannatul Ferdous
(74) *Attorney, Agent, or Firm* — Daly, Crowley, Mofford & Durkee, LLP

(57) ABSTRACT

Systems and methods described herein are directed towards differential current sensing a current sensor having two or more magnetic field sensing elements that are oriented to sense a magnetic field generated by a current through an external conductor in the same direction. The current sensor can be positioned such that at least one first magnetic field sensing element is vertically aligned with the external conductor and at least one second magnetic field sensing element is not vertically aligned with the external conductor. The magnetic field sensing elements may be spaced from each to measure a gradient field and can generate a magnetic field signal indicative of a distance between the respective magnetic field sensing element and the current carrying external conductor. A difference between the magnetic field signals can be determined that is indicative of the current through the external conductor.

28 Claims, 11 Drawing Sheets

(56) References Cited

U.S. PATENT DOCUMENTS

| | | | |
|---|---|---|---|
| 7,598,601 B2 | 10/2009 | Taylor et al. | |
| 7,709,754 B2 | 5/2010 | Doogue et al. | |
| 7,746,056 B2 | 6/2010 | Stauth et al. | |
| 7,816,905 B2 | 10/2010 | Doogue et al. | |
| 8,080,994 B2 | 12/2011 | Taylor et al. | |
| 9,081,041 B2 * | 7/2015 | Friedrich | G01R 15/207 |
| 9,190,606 B2 | 11/2015 | Liu et al. | |
| 2006/0219436 A1 * | 10/2006 | Taylor | H01L 24/37 |
| | | | 174/529 |
| 2007/0170533 A1 * | 7/2007 | Doogue | B82Y 25/00 |
| | | | 257/422 |
| 2015/0022187 A1 | 1/2015 | Taylor et al. | |

OTHER PUBLICATIONS

Melexis Datasheet MLX91206 "IMC-Hall® Current Sensor (Triaxis® Technology)", Apr. 2016, 25 pages.

Sensitec datasheet CFS1000 "Integrated MagnetoResistive Current Sensor", Apr. 25, 2016, 27 pages.

\* cited by examiner

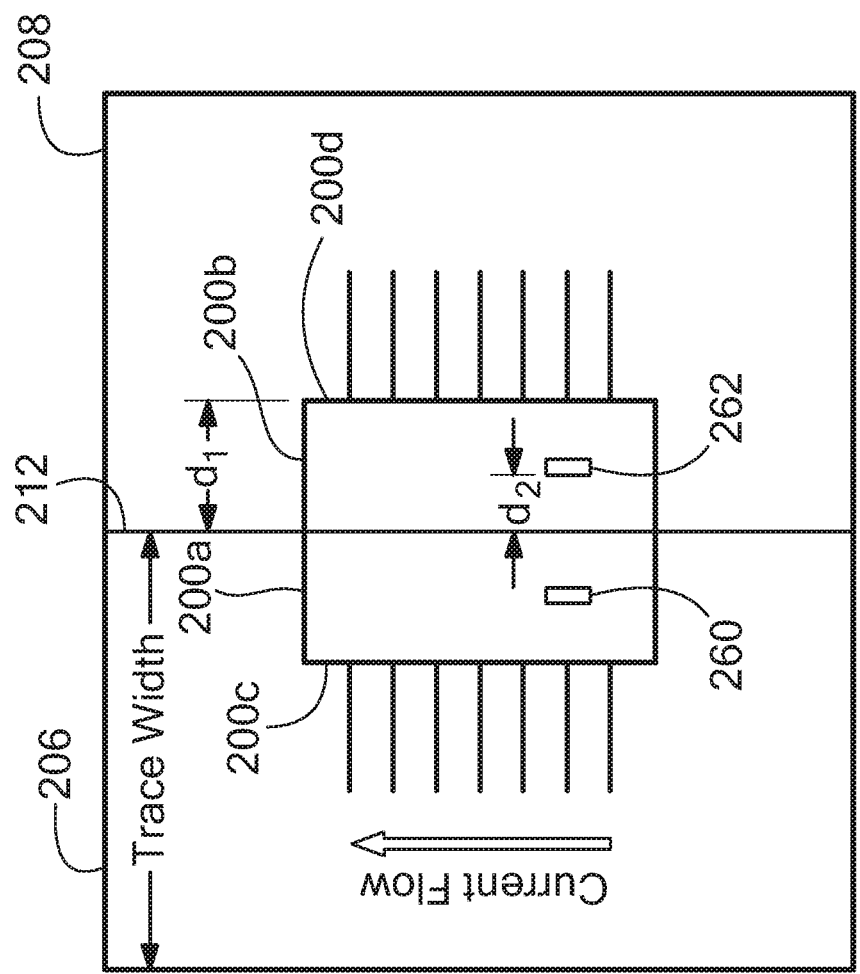
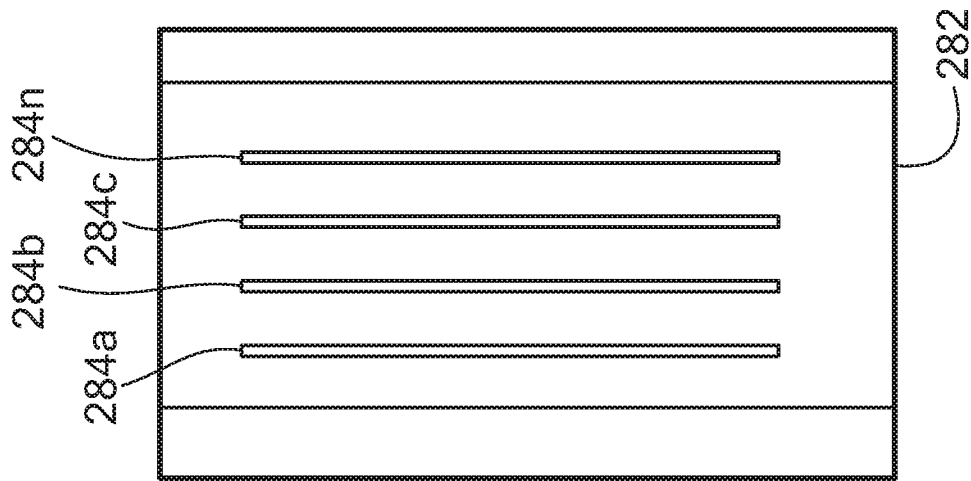
FIG. 2A
FIG. 2B

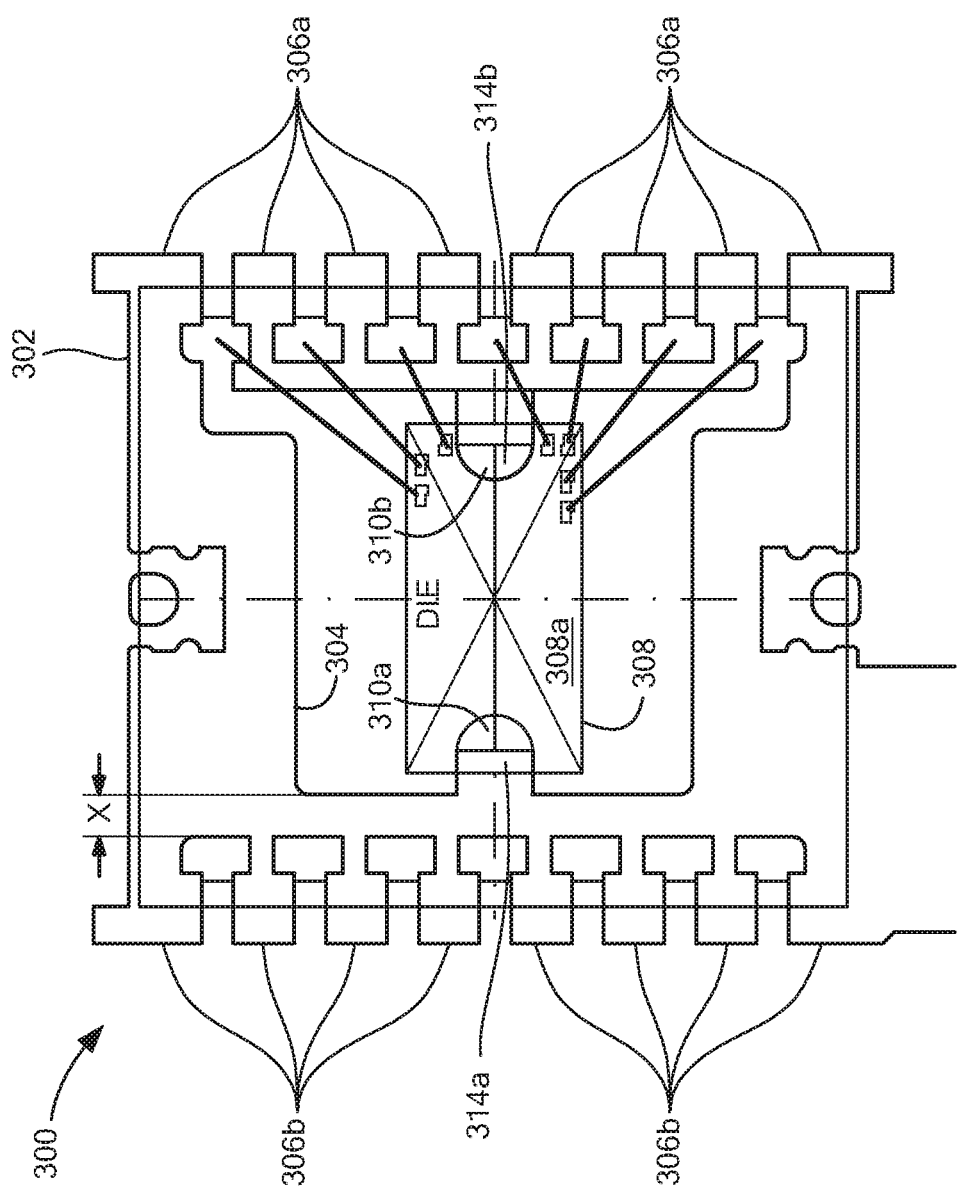

SYSTEMS AND METHODS FOR CURRENT SENSING

BACKGROUND

Some conventional electrical current sensors are positioned near a current-carrying conductor to sense a magnetic field generated by the current through the conductor. The current sensor generates an output signal having a magnitude proportional to the magnetic field induced by the current through the conductor.

The accuracy with which a magnetic field-based current sensor senses an intended current can be affected by its immunity to stray magnetic fields. Some conventional current sensors employ shields, sometimes in the form of a ferrite or other magnetic core positioned around the conductor, to concentrate the magnetic field in the vicinity of the sensor and to thereby provide a level of shielding against stray fields, such as those that may be caused by currents flowing in adjacent conductors.

SUMMARY

Systems and methods described herein are directed towards current sensing by a current sensor having two or more magnetic field sensing elements that are oriented to sense a magnetic field generated by a current through an external conductor in the same direction. Each of the two or more magnetic field sensing elements can generate a magnetic field signal indicative of a distance between the respective magnetic field sensing element and the current carrying conductor. In some embodiments, the outputs of the magnetic field sensing elements can be subtracted to differentially measure the magnetic field generated by the current through the conductor. Thus, a difference signal corresponding to the difference between the magnetic field signals can be generated that rejects stray fields and is indicative of the current through the conductor.

The current sensing can be performed by positioning the current sensor over an edge (e.g., straddling the edge) of the conductor such that at least one first magnetic field sensing element is over or otherwise vertically aligned with the conductor and at least one second magnetic field sensing element is not over or otherwise vertically aligned with the conductor. The magnetic field sensing elements may be spaced from each to measure a gradient. Thus, the spacing may be selected based on a desired gradient (e.g., largest gradient) and/or a level of the current through the conductor.

The current sensor may be provided in a package having a lead frame that allows for high isolation between the conductor and the output signal lead(s) of the sensor. For example, the current sensor can include one or more substrates (e.g., semiconductor substrates) that support the magnetic field sensing elements and the lead frame can include a die attach paddle and a plurality of leads. The one or more substrates can be attached to the die attach paddle. In an embodiment, a first plurality of leads adjacent to a first side of the die attach paddle can be coupled to the die attach paddle and a second plurality of leads adjacent to a second side of the die attach paddle can be spaced from the die attach paddle. With this arrangement, one set of leads can be coupled to a non-current carrying surface adjacent to the conductor and the second set of leads can be coupled to the current carrying conductor but spaced from the die attach paddle. With the second set of leads spaced from (i.e., not in contact with) the die attach paddle, high isolation from the conductor is achieved. The spacing between the second set of leads and the die attach paddle may be selected based at least in part on a level of the current, a voltage of the conductor, and isolation requirements. It should be appreciated that in the current sensor arrangements described herein, the conductor can be isolated from the one or more substrates and the first plurality of leads through a variety of different techniques. For example, in some embodiments, to provide voltage isolation, the die attach paddle can be coupled to the second plurality of leads. However, an isolation layer (e.g., tape, non-conductive die attach paddle) can be disposed between the one or more substrates and the die attach paddle and one or more wire bonds can be coupled from the one or more substrates to the signal leads.

The conductor may be referred to herein as an external conductor as the current sensor is disposed over or otherwise adjacent to the conductor and the current does not flow through the current sensor package. For example, in some embodiments, the current sensor may be positioned such that it hovers over the edge of the external conductor.

A downset configuration of the die attach paddle may be provided such that at least some of the plurality of leads are positioned at different heights than the die attach paddle (and thus substrate and magnetic field sensing elements) relative to the conductor to bring the die attach paddle closer to the conductor than otherwise possible. For example, the plurality of leads can be disposed at a first height with respect to the conductor and the die attach paddle can be disposed at a second height with respect to the conductor. The first height can be greater than the second height such that the die attach paddle, substrate and plurality of magnetic field sensing elements are disposed at a lower height and in a closer proximity to the current carrying conductor, than otherwise possible.

In a first aspect, a current sensor for sensing a magnetic field generated by a current through an external conductor comprises a lead frame having a first surface and a second, opposing surface, the lead frame comprising a die attach paddle and a plurality of leads, one or more substrates attached to the die attach paddle and a plurality of magnetic field sensing elements supported by the one or more substrates. At least one first magnetic field sensing element of the plurality of magnetic field sensing elements is spaced from at least one second magnetic field sensing element of the plurality of magnetic field sensing elements and the at least one first magnetic field sensing element and the at least one second magnetic field sensing element are orientated to sense the magnetic field in the same direction. The at least one first magnetic field sensing element is configured to generate a first magnetic field signal indicative of a distance between the at least one first magnetic field sensing element and the conductor and wherein the at least one second magnetic field sensing element is configured to generate a second magnetic field signal indicative of a distance between the at least one second magnetic field sensing element and the conductor. The current sensor further comprises a circuit responsive to the first magnetic field signal and to the second magnetic field signal and configured to generate a difference signal indicative of a difference between the first magnetic field signal and the second magnetic field signal. The difference is indicative of the current carried by the conductor. For example, the first and second magnetic field signals can be proportional to the current carried by the conductor and that the proportionality constant can be indicative of the distance between the respective magnetic field sensing elements.

In some embodiments, the one or more substrates may have a first surface attached to the die attach paddle and a second, opposing surface, and the plurality of magnetic field sensing elements can be supported by the second surface of the one or more substrates. In other embodiments, the one or more substrates may have a first surface attached to the die attach paddle and proximate to the lead frame, and a second, opposing surface distal from the lead frame and the plurality of magnetic field sensing elements can be supported by the first surface of the one or more substrates.

The at least one first magnetic field sensing element can be vertically aligned with the external conductor and the at least one second magnetic field sensing element can be positioned such that it is not vertically aligned with the external conductor. The die attach paddle may comprise one or more slits, slots or apertures. The one or more slits, slots or apertures can be configured to reduce or otherwise limit the amount of eddy currents forming in the die attach paddle.

The plurality of leads can be disposed at a first height with respect to the external conductor and the die attach paddle is disposed at a second, different height with respect to the external conductor, wherein the first height is greater than the second height.

In some embodiments, a mold material encloses the one or more substrates and a portion of the lead frame including the die attach paddle. A first plurality of the leads can extend from a first side of the mold material and a second plurality of the leads can extend from a second, opposite side of the mold material, and the die attach paddle is attached to one or more of the first plurality of the leads and is spaced from the second plurality of leads.

The plurality of magnetic field sensing elements may comprise at least one of a Hall effect element or a magnetoresistance element. The magnetoresistance element may comprise at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

In another aspect, a current sensor system is provided comprising a printed circuit board (PCB), a conductor supported by the PCB and configured to carry a current and a current sensor comprising a plurality of magnetic field sensing elements supported by one or more substrates. At least one of the plurality of magnetic field sensing elements is vertically aligned with the conductor and at least one of the plurality of magnetic field sensing elements is not vertically aligned with the conductor.

A plurality of slots (or slits) may be formed in the conductor in a direction of the current. The slots (or slits) may be formed to reduce or otherwise mitigate adverse effects of skin effect and current crowding at higher current frequencies. The conductor has an edge and the at least one first magnetic field sensing element and the at least one second magnetic field sensing element can be positioned such that they are substantially equidistant from the edge.

The current sensor may further comprise a circuit responsive to a first magnetic field signal from the at least one magnetic field sensing element that is vertically aligned with the conductor and to a second magnetic field signal from the at least one magnetic field sensing element that is not vertically aligned with the conductor. The circuit can be configured to generate a difference signal indicative of the difference between the first magnetic field signal and the second magnetic field signal. The difference signal can be indicative of the current carried by the conductor.

In some embodiments, the conductor comprises a conductive trace supported by the PCB and proximate to the current sensor. In other embodiments, the conductor comprises a conductive trace disposed distal from the current sensor such that the PCB is positioned between the conductive trace and the current sensor.

The current sensor may further comprise a lead frame having a first surface adjacent to the PCB and a second, opposing surface distal from the PCB, the lead frame comprising a die attach paddle and a plurality of leads, and the one or more substrates attached to the die attach paddle. In some embodiments, the one or more substrates can have a first surface attached to the die attach paddle and a second, opposing surface and the plurality of magnetic field sensing elements can be supported by the second surface of the one or more substrates. In other embodiments, the one or more substrates can have a first surface attached to the die attach paddle and proximate to the lead frame, and a second, opposing surface distal from the lead frame, and the plurality of magnetic field sensing elements can be supported by the first surface of the one or more substrates.

The die attach paddle may comprise one or more slits, slots or apertures. The plurality of leads can be disposed at a first height with respect to the conductor and the die attach paddle can be disposed at a second, different height with respect to the conductor. The first height can be greater than the second height.

The current sensor system may comprise a mold material enclosing the one or more substrates and a portion of the lead frame including the die attach paddle. A first plurality of the leads may extend from a first side of mold material and a second plurality of the leads may extend from a second, opposite side of the mold material. The die attach paddle can be attached to the first plurality of the leads and is not attached to the second plurality of leads.

The plurality of magnetic field sensing elements may comprise at least one of a Hall effect element or a magnetoresistance element. The magnetoresistance element may comprise at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

In another aspect, a current sensor for sensing a magnetic field generated by a current through an external conductor is provided comprising a lead frame having a first surface and a second, opposing surface, a die attach paddle, a first plurality of leads and a second plurality of leads, the die attach paddle having first side adjacent to the first plurality of leads and second, opposing side adjacent to the second plurality of leads, wherein the first side of the die attach paddle is attached to at least one of the first plurality of leads and wherein the second side of the die attach paddle is spaced from the second plurality of leads, one or more substrates attached to the die attach paddle and a plurality of magnetic field sensing elements supported by the one or more substrates. At least one first magnetic field sensing element of the plurality of magnetic field sensing elements is spaced from at least one second magnetic field sensing element of the plurality of magnetic field sensing elements such that the at least one first magnetic field sensing element is closer to the first side of the die attach paddle than to the second side of the die attach paddle and the at least one second magnetic field sensing element is closer to the second side of the die attach paddle than to the first side of the die attach pad.

In some embodiments, the one or more substrates can have a first surface attached to the die attach paddle and a second, opposing surface and the plurality of magnetic field sensing elements can be supported by the second surface of the one or more substrates. In other embodiments, the one or more substrates can have a first surface attached to the die attach paddle and proximate to the lead frame, and a second, opposing surface distal from the lead frame and the plurality of magnetic field sensing elements can be supported by the first surface of the one or more substrates.

The at least one first magnetic field sensing element can be configured to generate a first magnetic field signal indicative of a distance between the at least one first magnetic field sensing element and the conductor and the at least one second magnetic field sensing element can be configured to generate a second magnetic field signal indicative of a distance between the at least one second magnetic field sensing element and the conductor. The current sensor may further comprise a circuit responsive to the first magnetic field signal and to the second magnetic field signal and configured to generate a difference signal indicative of a difference between the first magnetic field signal and the second magnetic field signal. The difference can be indicative of the current carried by the conductor.

In some embodiments, the at least one first magnetic field sensing element is vertically aligned with the conductor and the at least one second magnetic field sensing element is not vertically aligned with the conductor. The die attach paddle may comprise one or more slits, slots or apertures.

The first and second plurality of leads can be disposed at a first height with respect to the conductor and the die attach paddle can be disposed at a second, different height with respect to the conductor. The first height can be greater than the second height.

The current sensor may further comprise a mold material enclosing the one or more substrates and a portion of the lead frame including the die attach paddle. The first plurality of the leads can extend from a first side of mold material and the second plurality of the leads can extend from a second, opposite side of the mold material.

The plurality of magnetic field sensing elements may comprise at least one of a Hall effect element or a magnetoresistance element. The magnetoresistance element may comprise at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

In another aspect, a method for sensing a magnetic field generated by a current through an external conductor comprises providing a lead frame having a first surface and a second, opposing surface, the lead frame comprising a die attach paddle and a plurality of leads, wherein one or more substrates are attached to the die attach paddle, providing a current sensor comprising a plurality of magnetic field sensing elements supported by a surface of one or more substrates, wherein at least one first magnetic field sensing element of the plurality of magnetic field sensing elements is spaced from at least one second magnetic field sensing element of the plurality of magnetic field sensing elements, sensing the magnetic field by the at least one first magnetic field sensing element and the at least one second magnetic field sensing element, wherein the at least one first magnetic field sensing element and the at least one second magnetic field sensing element are orientated to sense the magnetic field in the same direction, generating a first magnetic field signal indicative of a first distance between the at least one first magnetic field sensing element and the conductor, generating a second magnetic field signal indicative of a second distance between the at least one second magnetic field sensing element and the conductor and generating a difference signal indicative of a difference between the first magnetic field signal and the second magnetic field signal, wherein the difference is indicative of the current carried by the conductor.

The method may further comprise positioning the at least one first magnetic field sensing element such that it is vertically aligned with the conductor and positioning the at least one second magnetic field sensing element such that it is not vertically aligned with the conductor. One or more slits, slots or apertures may be formed in the die attach paddle.

In some embodiments, the method further comprises disposing the plurality of leads at a first height with respect to the conductor and disposing the die attach paddle at a second, different height with respect to the conductor. The first height can be greater than the second height.

The one or more substrates and a portion of the lead frame including the die attach paddle may be enclosed in a mold material. A first plurality of the leads may extend from a first side of mold material and a second plurality of the leads may extend from a second, opposite side of the mold material. The die attach paddle can be attached to one or more of the first plurality of the leads and is spaced from the second plurality of leads.

The plurality of magnetic field sensing elements may comprise at least one of a Hall effect element or a magnetoresistance element. The magnetoresistance element may comprise at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

In another aspect, a method for sensing a magnetic field generated by a current through a conductor is provided comprising providing a printed circuit board (PCB) supporting the conductor, providing a current sensor comprising a plurality of magnetic field sensing elements supported by one or more substrates, positioning the current sensor over an edge of the conductor such that a first magnetic field sensing element of the plurality of magnetic field sensing elements is vertically aligned with the conductor and a second magnetic field sensing element of the plurality of magnetic field sensing elements is it not vertically aligned with the conductor; wherein the conductor is supported by the PCB and configured to carry the current, and computing a difference between a first magnetic field signal generated by the first magnetic field sensing element and a second magnetic field signal generated by the second magnetic field sensing element, wherein the difference is indicative of the current through the conductor.

The method may further comprise forming a plurality of slots formed in the conductor in a direction of the current. In some embodiments, positioning the current sensor over the edge of the conductor comprises positioning the at least one first magnetic field sensing element and the at least one second magnetic field sensing element such that they are substantially equidistant from the edge.

The method may further comprise providing the conductor as a conductive trace disposed distal from the current sensor such that the PCB is positioned between the conductive trace and the current sensor.

In some embodiments, providing the current sensor further comprises providing a lead frame having a first surface adjacent to the PCB and a second, opposing surface distal from the PCB, the lead frame comprising a die attach paddle and a plurality of leads. A first surface of the one or more substrates can be coupled to the die attach paddle, wherein the plurality of magnetic field sensing elements can be supported by a second, opposite surface of the one or more substrates. In other embodiments, a first surface of the one or more substrates can be coupled to the die attach paddle, wherein the plurality of magnetic field sensing elements can be supported by the first surface of the one or more substrates.

One or more slits, slots or apertures in the die attach paddle. The method may further comprise providing the plurality of leads at a first height with respect to the conductor and providing the die attach paddle at a second, different height with respect to the conductor. The first height can be greater than the second height.

The method may further comprise enclosing the one or more substrates and a portion of the lead frame including the die attach paddle in a mold material. A first plurality of the leads may extend from a first side of mold material and a second plurality of the leads may extend from a second, opposite side of the mold material. The die attach paddle can be attached to one or more of the first plurality of the leads and is not attached to the second plurality of leads.

The plurality of magnetic field sensing elements may comprise at least one of a Hall effect element or a magnetoresistance element. The magnetoresistance element may comprise at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

In another aspect, a current sensor for sensing a magnetic field generated by a current through an external conductor, the magnetic field having direction associated with a direction of the current through the conductor, comprises a first means for sensing the magnetic field generated by the current to generate a first magnetic field signal indicative of a distance between the first magnetic field sensing means and the conductor, a second means for sensing the magnetic field generated by the current to generate a second magnetic field signal indicative of a distance between the second magnetic field sensing means and the conductor, means for supporting the first magnetic field sensing means and the second magnetic field sensing means in a spaced relationship, but with both the first and second magnetic field sensing means oriented to sense the magnetic field in the same direction and means for determining a difference between the first magnetic field signal and the second magnetic field signal, wherein the difference is indicative of the current through the conductor.

The first magnetic field sensing means can be vertically aligned with the external conductor and the second magnetic field sensing means can be positioned such that it is not vertically aligned with the external conductor.

BRIEF DESCRIPTION OF THE DRAWINGS

The foregoing features may be more fully understood from the following description of the drawings in which:

FIG. 2A shows the spacing of one or more magnetic field sensing elements within the current sensor of FIG. 1 relative to the conductor;

FIG. 2B shows one or more slits formed in a conductor;

FIG. 3 is a plain view of the current sensor of FIG. 1;

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensing circuit" is used to describe a circuit that uses a magnetic field sensing element, generally in combination with other circuits. Magnetic field sensing circuits are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
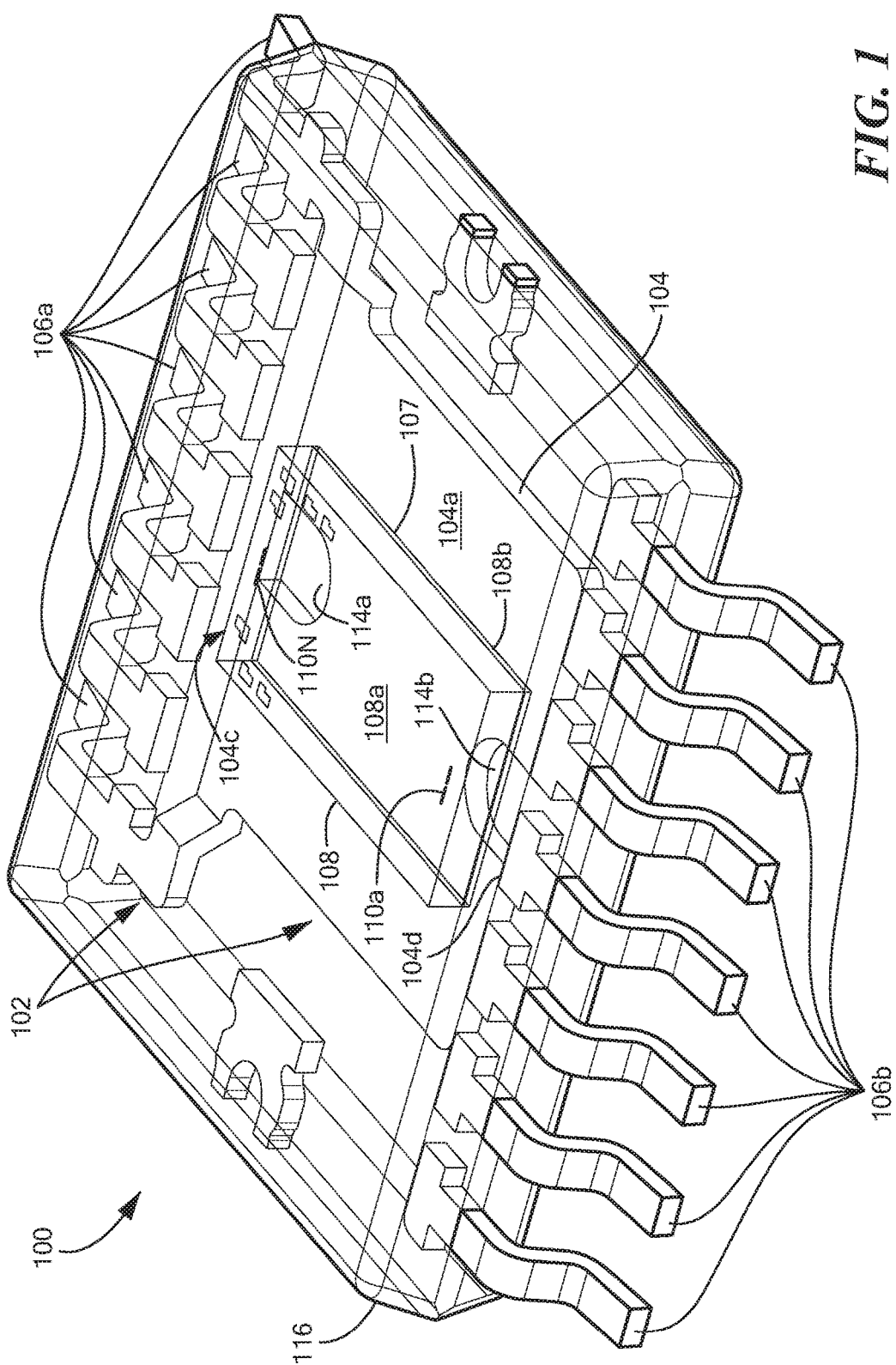
FIG. 1 shows a current sensor having a plurality of magnetic field sensing elements supported by a substrate and attached to a die attach paddle.

Now referring to FIG. 1, a current sensor 100 includes a lead frame 102, a substrate 108 and a plurality of magnetic field sensing elements 110a-110n supported by substrate 108. Current sensor 100 can be positioned over an edge of an external conductor (FIG. 2) and be configured to perform current sensing based at least in part on a relative spacing between each of the at least two of the magnetic field sensing elements 110a-110n and the conductor.

Magnetic field sensing elements 110a-110n are oriented or otherwise positioned such that each of the magnetic field sensing elements 110a-110n can sense a magnetic field generated by a current through an external conductor (FIG. 2) in the same direction. However, each of the magnetic field sensing elements 110a-110n can be positioned at different distances from the external conductor and thus generate magnetic field signals at different levels based at least in part on their respective distance from the external conductor. A difference between the magnetic field signals generated by each of the magnetic field sensing elements 110a-110n can be used to determine the current through the external conductor. Further, the spacing between at least one first magnetic sensing element 110a and at least one second magnetic field sensing element 110n may be selected to optimize the gradient between the magnetic fields experienced by each of the sensing elements 110a, 110n.

Figure 7:
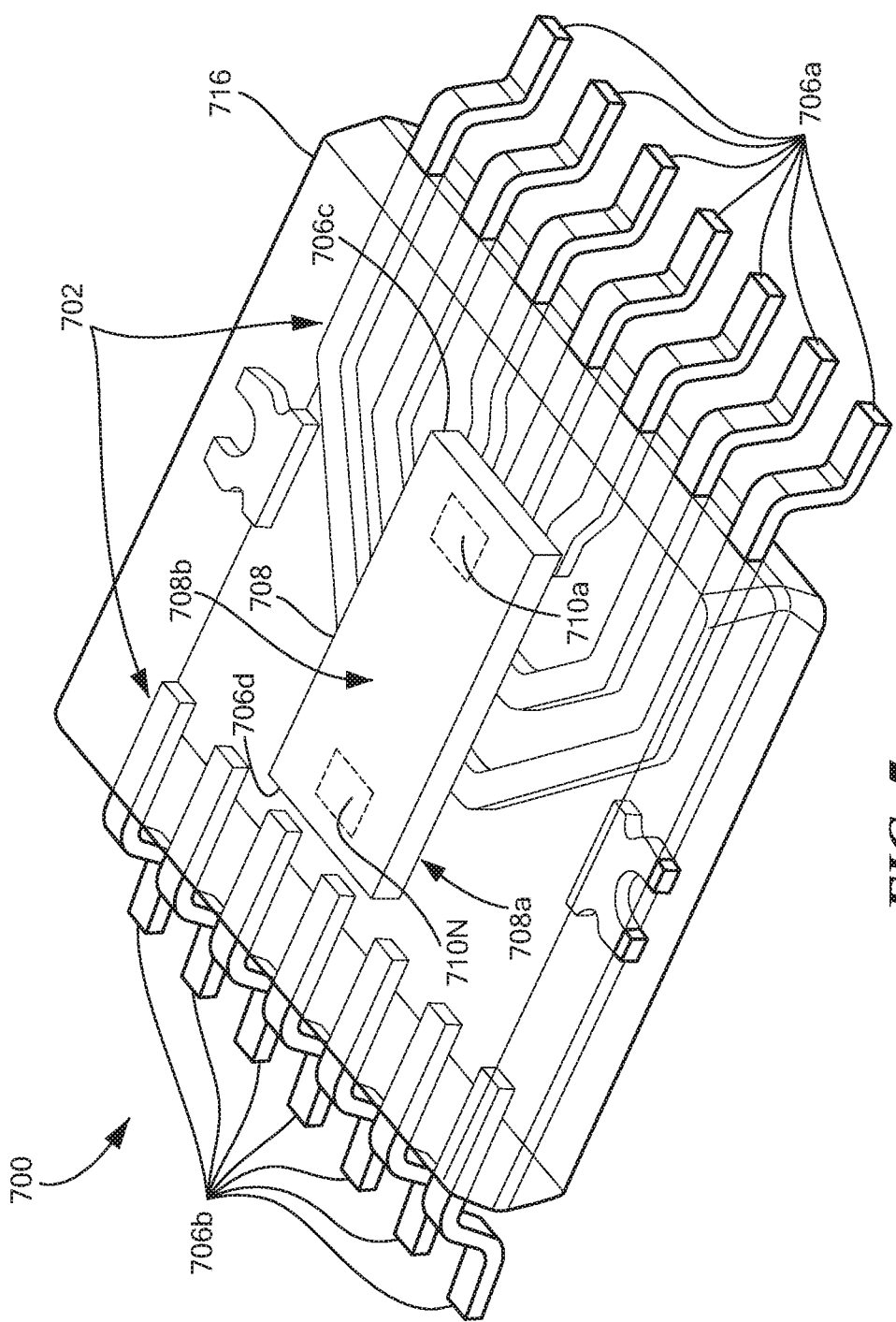
FIG. 7 shows a flip chip current sensor.

Lead frame 102 includes a die attach paddle 104 and a plurality of leads 106. Substrate (e.g., semiconductor substrate) or die 108 is attached to die attach paddle 104, as may be achieved with an adhesive layer 107. For example, and as illustrated in FIG. 1, a second surface 108b of substrate 108 is coupled to a first surface 104a of die attach paddle 104 (i.e., die-up configuration). It should be appreciated however, that in other embodiments, a first surface 108a of substrate 108 may be coupled to a second surface 104b of die attach paddle 104 (i.e., flip chip configuration as shown in FIG. 7). It will also be understood that while a single semiconductor die 108 is shown, the current sensor can include more than one die, with each such die supporting magnetic field sensing element(s) and/or supporting circuitry.

Lead frame 102 can be configured to provide high voltage isolation between signal leads as may carry relatively low voltage signals and high voltage leads as may contact an external conductor. For example, leads 106 includes a first plurality of leads 106a extending from a first side 104c of die attach paddle 104 and a second plurality of leads 106b spaced from (e.g., not in contact with) a second side 104d of die attach paddle 104. Leads 106a may be coupled to a non-current carrying surface and leads 106b may be coupled to a current carrying surface of a conductor. For example, in some embodiments, leads 106a may be coupled to a microcontroller or other surface that may utilize low voltage current measurement signals. It should be appreciated that a non-current carrying surface as referred to herein may refer to a low voltage surface or a surface carry a current less than a current carrying surface of a conductor (e.g., conductor 206 of FIG. 2.). Thus, leads 106b (coupled to current carrying conductor) may be electrically isolated from die attach paddle 104. The space gap between leads 106b and die attach paddle 104 is shown further below in connection with FIG. 3.

It should be appreciated that in the current sensor arrangements described herein, the conductor (e.g., conductor 206 of FIG. 2.) can be isolated from the one or more substrates 108 and first plurality of leads 106a through a variety of different techniques. For example, in some embodiments, to provide voltage isolation, die attach paddle 104 can be coupled to second plurality of leads 106b. However, an isolation layer (e.g., tape, non-conductive die attach paddle) can be disposed between the one or more substrates 108 and die attach paddle 104 and one or more wire bonds can be coupled from the one or more substrates 108 to the signal leads.

Die attach paddle 104 may include one or more cutouts, slits, slots or apertures 114a, 114b to reduce eddy currents. For example, eddy currents may be formed near a current carrying conductor and oppose magnetic fields, generated by the current carrying conductor that are to be sensed by magnetic field sensing elements 110a-110n. The one or more cutouts 114a, 114b may be configured to limit the amount of eddy currents forming in the die attach paddle 104. The one or more cutouts 114a, 114b will be described in greater detail below with respect to FIG. 3.

Substrate 108 may include a semiconductor substrate. In some embodiments, substrate 108 may include a semiconductor material and any material used for supporting semiconductor materials. For example, substrate 108 may include, but not limited to, a semiconductor material disposed on at least one of glass, ceramic, or polymer.

A mold material 116 is provided to enclose die attach paddle 104, substrate 108, magnetic field sensing elements 110a-110n and portions of leads 106, as shown.

Magnetic field sensing elements 110a-110n may include one or more Hall effect elements or one or more magnetoresistance elements. For example, the magnetoresistance elements may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

In an embodiment, current sensor lead frame can have a downset configuration such that portions of the plurality of leads 106 are positioned at different heights than the die attach paddle 104 (and thus, also than the substrate 108 and magnetic field sensing elements 110a-110n).

Figure 1A:
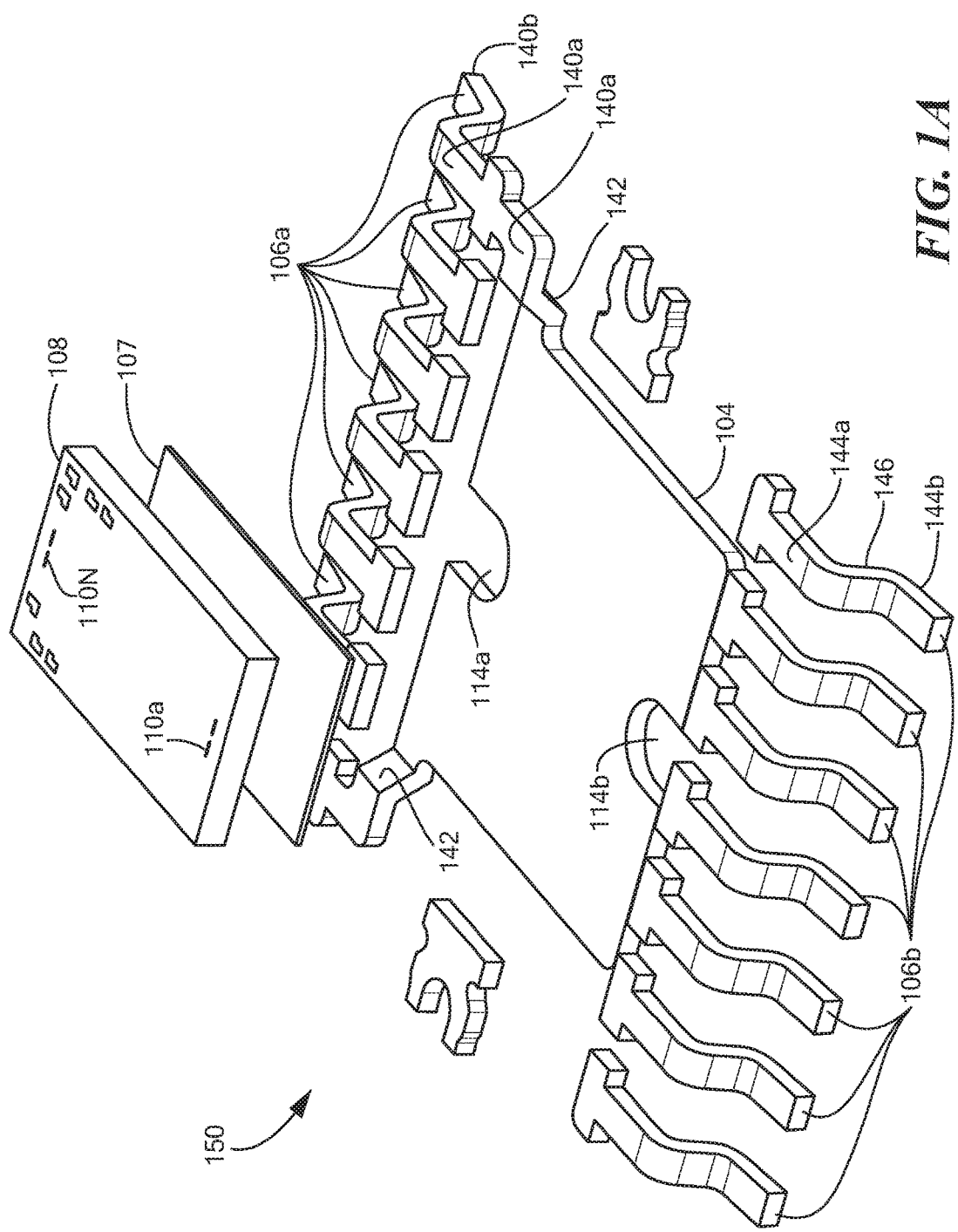
FIG. 1A shows an exploded view of the current sensor of FIG. 1.

For example, and referring also to the exploded view of current sensor 150 in FIG. 1A, leads 106a include a first portion 140a at a first height and a connect portion 142 coupled between the first portion 140a and the die attach paddle 104. Thus, the first lead portions 140a can be at a first height and the die attach paddle 104 can be at a different height that in some embodiments is less than the first height. In such embodiments, when the current sensor is positioned relative to a current carrying conductor, the first lead portions 140a may be higher than the die attach paddle 104 relative to the conductor, in order to thereby bring the die attach paddle closer to the conductor than otherwise possible.

A second portion 140b of leads 106a may be at a second lower height than portions 140a to provide surface mount pads for coupling to a printed circuit board or other support structure. Similarly leads 106b can have a first portion 144a at a first height and second portions 144b at a second, lower height to form surface mount pads.

The first portion 144a of leads 106b can be spaced from (i.e., not in contact with) die attach paddle 104. Thus, in applications in which leads 106b are coupled to a current carrying conductor (see, e.g., FIG. 2), die attach paddle 104 and electrically coupled leads 106a can be electrically isolated from the current carrying conductor.

Figure 2:
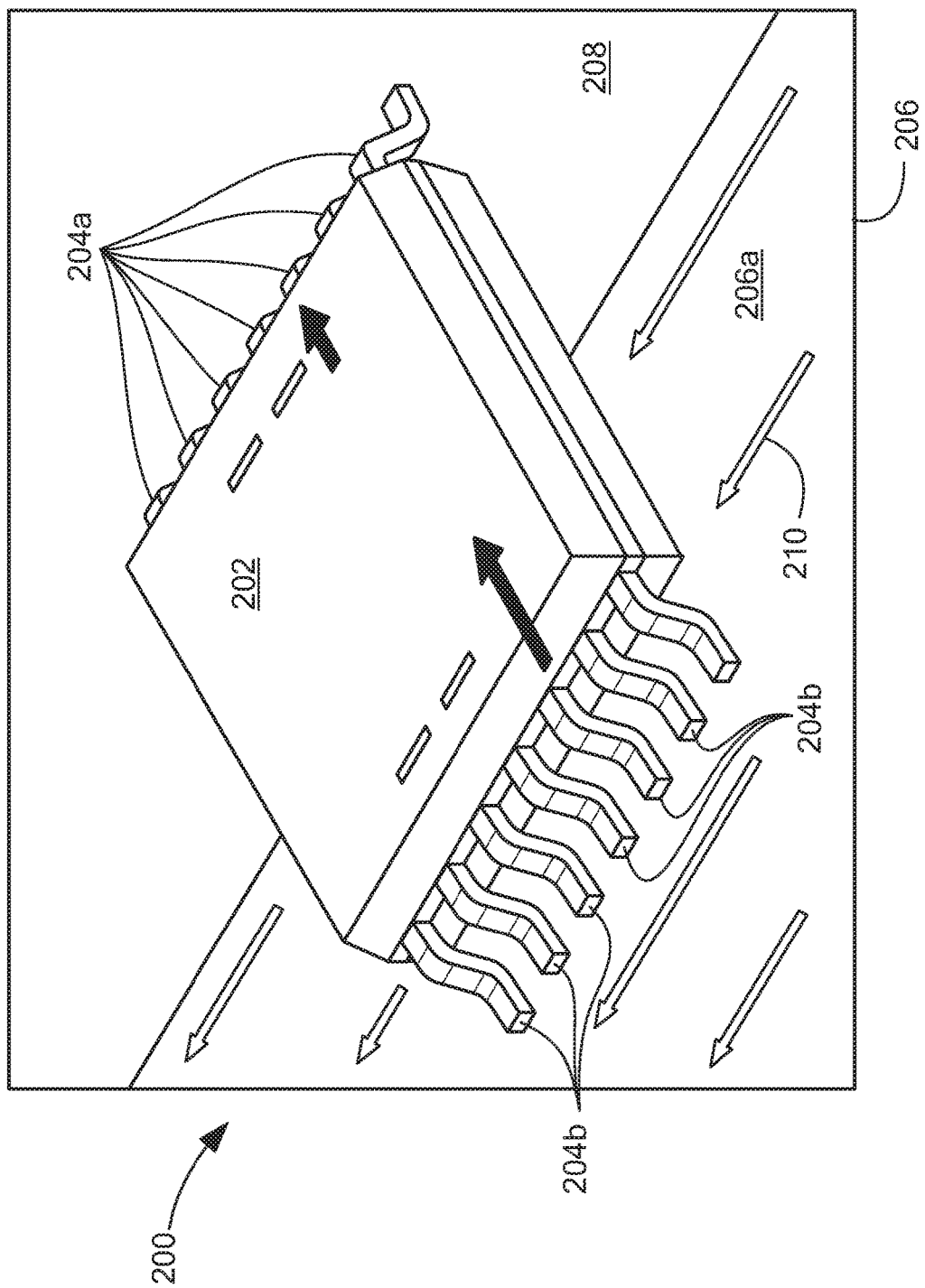
FIG. 2 shows the current sensor of FIG. 1 positioned over an edge of a conductor.

Now referring to FIG. 2, a current sensor 200 is positioned over an edge 212 of external conductor 206 that is configured to carry a current 210. Current sensor 200 may be the same as or substantially similar to current sensor 100 of FIG. 1 and thus may include a plurality of magnetic field sensing elements configured to sense a magnetic field generated by the current 210 through conductor 206. In an embodiment, the plurality of magnetic field sensing elements can be oriented or otherwise positioned within current sensor 200 to sense the magnetic field generated by current 210 through conductor 206 in the same direction. In other words, the magnetic field sensing elements are positioned within the sensor package 200 such that when the sensor 200 is disposed in proximity to (i.e., disposed over) the conductor 206, the magnetic field (generated by the current through the conductor) incident on each of the sensing elements has the same polarity.

As illustrated in FIG. 2, a first plurality of leads 204a of current sensor 200 are coupled to a non-current carrying surface 208 and a second plurality of leads 204b are coupled to conductor 206. Thus, current sensor 200 can be positioned over edge 212 of conductor 206, as shown. First plurality of leads 204a and second plurality of leads 204b may be the same as or substantially similar to respective leads 106a and leads 106b of current sensor 100 of FIG. 1. Thus, in an embodiment, leads 204a may be coupled to a die attach paddle within current sensor 200 and leads 204b may be spaced from (e.g., not in contact with) the die attach paddle within current sensor 200. Thus, current sensor 200 may provide high voltage isolation between leads 204a and conductor 206.

Referring also to FIG. 2A, current sensor 200 can be positioned over edge 212 of conductor 206 such that a first magnetic sensing element 260 is vertically aligned with (here over) conductor 206 and a second magnetic sensing element 262 is not vertically aligned with conductor 206 and instead is aligned with a non-current carrying surface 208 (i.e., with magnetic field sensing elements 260, 262 straddling the edge 212 of the conductor). Current sensor 200 can be configured to perform current sensing by comparing (e.g., subtracting) outputs of first and second magnetic field sensing elements 260, 262 in order to thereby sense the current by sensing a gradient between the magnetic field sensed by each sensing element 260, 262. Thus, the sensing methodology requires a difference (or gradient) in the magnetic fields experienced by the sensing elements 260, 262.

The position of current sensor 200 relative to conductor 206 can be selected based at least in part on a level of the current through conductor 206 and thus, the expected magnetic field strength, the sensitivity of the magnetic field sensing elements, and/or a magnetic field gradient to be measured. In some embodiments, it may be desirable to position the sensor 200 so that the sensing elements 260, 262 experience the largest magnetic field gradient possible (i.e., the largest difference between the magnetic fields experienced by the spaced magnetic field sensing elements 260, 262) as may occur when at least one first magnetic sensing element 260 is vertically aligned with the current carrying conductor 206 and at least one second magnetic sensing element 262 is not vertically aligned with the current carrying conductor 206. To this end, a first portion 200a of current sensor 200 is vertically aligned with (here over) conductor 206 and a second portion 200b is not vertically aligned with conductor 206 and instead is vertically aligned with a non-current carrying surface 208. In one such configuration, current sensor 200 may be positioned such that an edge 200c of first portion 200a and an edge 200d of second portion 200b are equidistant from edge 212 of conductor 206, here represented by a distance "d1" (and more specifically such that the sensing elements 260, 262 are equidistant from the conductor edge 212, here represented by a distance "d2"). Thus, first portion 200a and second portion 200b can be equal in size (e.g., width, length).

In other embodiments, first portion 200a and second portion 200b may be different in size. For example, current sensor 200 may be positioned such a distance from edge 212 of conductor 206 to edge 200c of first portion 200a is greater than a distance from edge 212 of conductor 206 to edge 200d of second portion 200b. In other embodiments, current sensor 200 may be positioned such a distance from edge 212 of conductor 206 to edge 200c of first portion 200a is less than a distance from edge 212 of conductor 206 to edge 200d of second portion 200b. In such configurations, the magnetic field sensing elements 260, 262 may not be equidistantly spaced from the conductor edge 212.

In some embodiments, all of current sensor 200 (or at least both magnetic field sensing elements 260, 262) may be vertically aligned (i.e., positioned over) conductor 206. In such embodiments, the sensing elements 260, 262 are not centered with respect to the conductor in order to ensure a gradient in the magnetic fields experienced by the sensing elements. In other embodiments, current sensor 200 can be positioned relative to conductor 206 such no portion (or at least neither magnetic field sensing element) is vertically aligned (i.e., positioned over) conductor 206 and instead current sensor 200 is vertically offset with respect to conductor 206.

It should be appreciated that although current sensor 200 is shown to include two magnetic field sensing elements 260, 262 in FIG. 2A, in other embodiments, current sensor 200 (or any current sensor described herein) may include more than two magnetic field sensing elements.

Now referring to FIG. 2B, conductor 282 is provided having one or more slits 284a-284n (here four). Conductor 282 may be the same as or substantially similar to conductor 206 of FIGS. 2-2A, however, conductor 282 includes slits 284a-284n. Slits 284a-284n may be formed to reduce or otherwise mitigate adverse effects of skin effect and current crowding at higher current frequencies. For example, as current flows through conductor 282 at high frequency, the current tends to crowd or migrate towards the outer surfaces and edges of conductor 282. Conductor slits 284a-284n have the effect of making the conductor 282 present electrical characteristics as if the current were being carried by multiple parallel wires, the number of wires being based on the number of slits 284a-284n in order to thereby normalize or otherwise equalize the current sensor response over frequency.

The slits 284a-284n may be formed such that their length is substantially parallel to a direction of the current flow through the conductor. In some embodiments, multiple slits 284a-284n may be formed such that they are equidistant from each other. In other embodiments, multiple slits 284a-284n may be formed such that they have different distances between them. The total number of slits 284a-284n may vary based at least in part on properties of conductor 282 and/or a particular application of a current sensor. For example, in some embodiments, conductor 282 may have one slit 284a-284n. In other embodiments, conductor 282 may have two or more slits 284a-284n.

Now referring to FIGS. 2C-2F, conductor 206 may take the form of a conductive trace 220 and a printed circuit board (PCB) 224. It should be appreciated that in some embodiments, each of the current traces illustrated in FIGS.

Figure 2C:
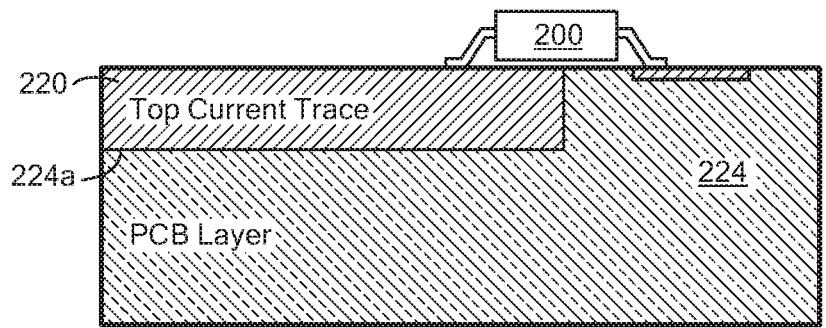
FIGS. 2C-2F show different embodiments of conductors comprising one or more conductive traces and a printed circuit board relative to the current sensor of FIG. 1.

2C-2F may include one or more slits, such as slits 284a-284n described above with respect to FIG. 2B. Conductive trace 220 may be formed, disposed on or otherwise supported by one or more surfaces of the PCB 224. For example, and as illustrated in FIG. 2C (in which the current can be considered to flow into the page), conductive trace 220 may be supported by a first surface 224a of PCB 224 such that conductive trace is disposed proximal to current sensor 200.

Figure 2D:
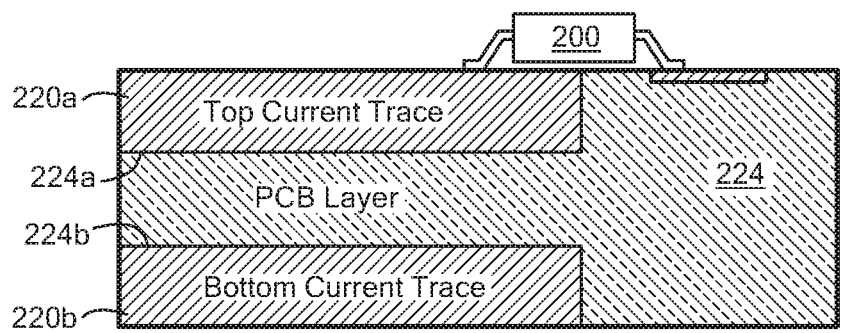

In FIG. 2D, a first conductive trace 220a is supported by first surface 224a of PCB 224 and a second conductive trace 220b is supported by a second opposite surface 224b of PCB 224. Current can be considered to flow into the page through both the first and second conductive traces 220a, 220b. This configuration can allow for higher current flow than otherwise possible, while also maintaining thermal performance.

Figure 2E:
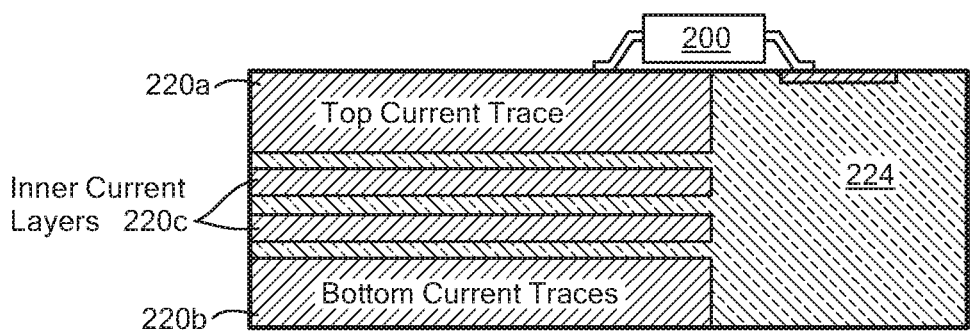

In FIG. 2E, first conductive trace 220a is supported by first surface 224a of PCB 224 and second conductive trace 220b is supported by second opposite surface 224b of PCB 224 and one or more additional conductive trace layers 220c are embedded within PCB 224. Current can be considered to flow into the page through both the conductive traces 220a, 220b, and 220c. This configuration can allow for maximum current flow, while also maintaining thermal performance. In embodiments in which the conductor is comprised of more than one conductive trace (e.g., FIGS. 2D and 2E), it will be appreciated that the multiple conductive traces can be electrically coupled in parallel so that current to be sensed by current sensor 200 flows in parallel through the multiple conductive traces. In some embodiments, the multiple conductive traces can be electrically coupled in series so that current to be sensed by current sensor 200 flows in series through the multiple conductive traces to increase the current to be sensed by current sensor 200 and improve sensor resolution.

Figure 2F:
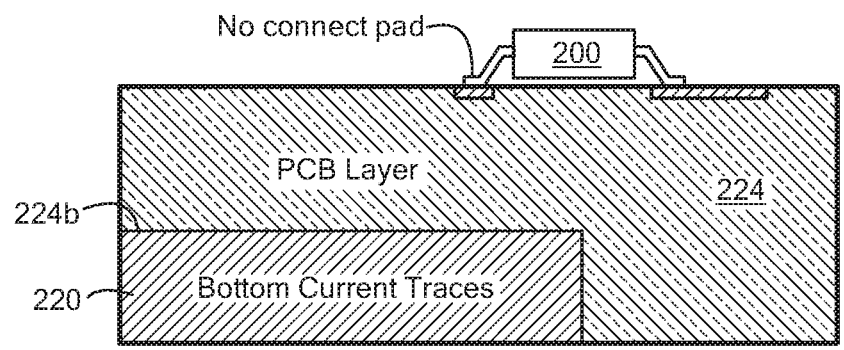

In other embodiments and as illustrated in FIG. 2F, conductive trace 220 may be supported by second surface 224b of PCB 224 such that conductive trace 220 is disposed distal from current sensor 200 and PCB 224 is disposed between conductive trace 220 and current sensor 200. Here again, current can be considered to flow into the page. This configuration provides a very high level of voltage isolation. It should be appreciated, that in the embodiment of FIG. 2F, current sensor 200 is coupled to a first surface 224a of PCB 224 and conductive trace 220 is supported by the second surface 224b to provide the voltage isolation. Thus, in some embodiments, secondary leads extending from current sensor 200 can be coupled to current sensor 200 and not isolated or otherwise spaced apart from current sensor 200 (in contrast to current sensor 100 described above with respect to FIG. 1).

Now referring to FIG. 3, a current sensor 300 is provided having a lead frame 302, the lead frame comprising a die attach paddle 304, a first plurality of leads 306a and a second plurality of leads 306b. A substrate 308 is coupled to die attach paddle 304. A first surface 308a of substrate 308 supports a first magnetic field sensing element 310a and a second magnetic field sensing element 310b.

Die attach paddle 304 may include one or more cutouts 314a, 314b (or slits, slots, apertures or other features) to limit or otherwise reduce the amount of eddy currents forming in die attach paddle 304 which may affect magnetic field sensing elements 310a, 310b. For example, eddy currents may be formed near a current carrying conductor and oppose magnetic fields generated by the current carrying conductor that are to be sensed by magnetic field sensing elements 310a, 310b. Thus, one or more cutouts 314a, 314b (here two) may be formed in die attach paddle 304 to reduce eddy currents.

As illustrated in FIG. 3, a first cutout 314a and a second cutout 314b may be formed such that each is aligned with (here under) at least one of magnetic field sensing elements 310a, 310b respectively. In other embodiments, cutouts 314a, 314b may be formed such that one or both are not generally aligned (e.g., not centered) with respect to at least one of magnetic field sensing elements 310a, 310b.

Second plurality of leads 306b are spaced a distance "x" from die attach paddle 304 and thus not in contact with die attach paddle. The spacing "x" may be selected to isolate die attach paddle 304 from a current carrying conductor to which the second plurality of leads 306b may be coupled. In some embodiments, the spacing "x" may be selected based at least in part on a level of the current through or voltage at the conductor and/or isolation requirements.

Figure 4:
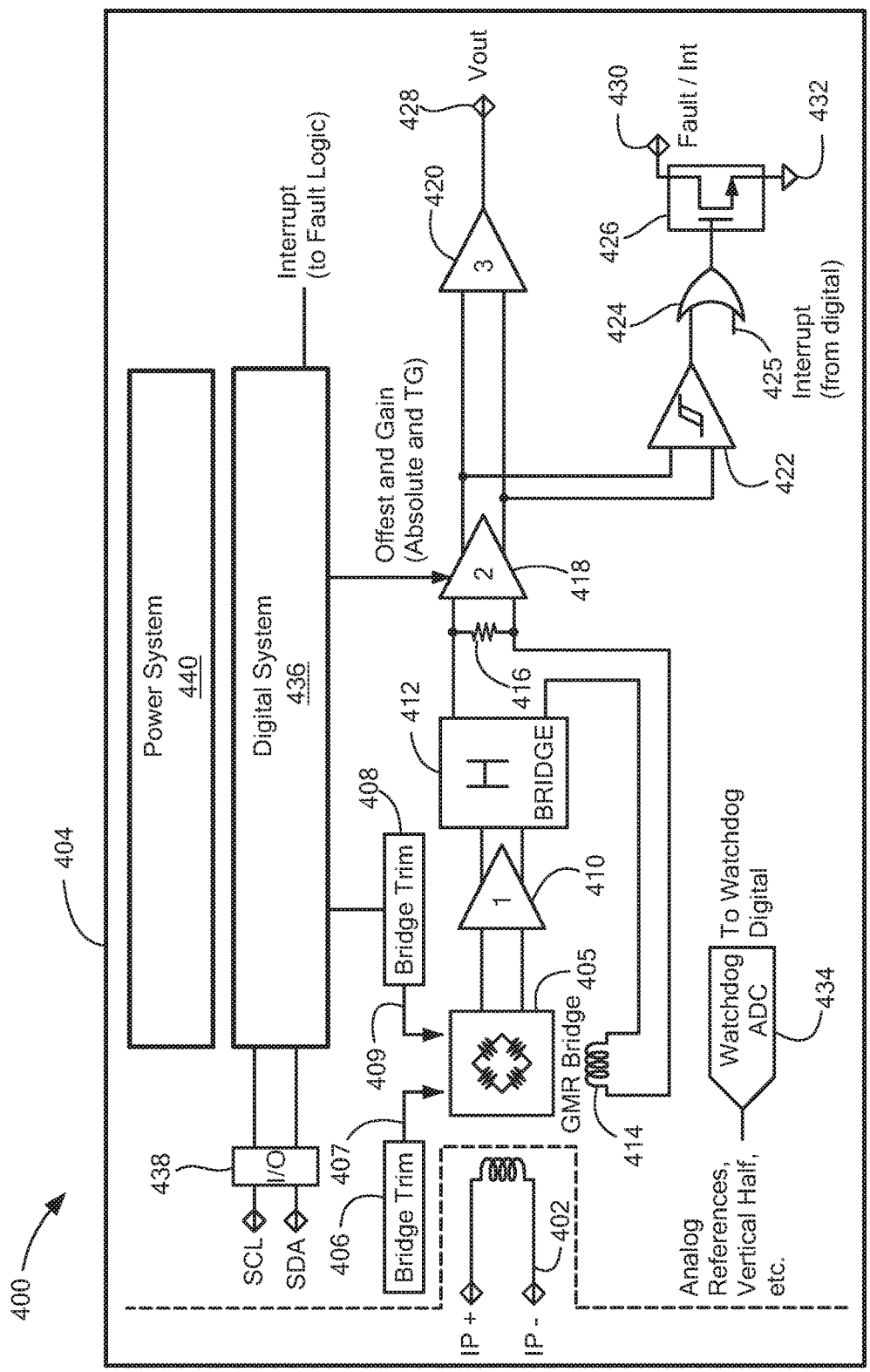
FIG. 4 is a circuit diagram of a current sensor.

Now referring to FIG. 4, a current sensor system 400 includes a current sensor 404 and conductor 402. Current sensor 404 may be the same as, or substantially similar to current sensor 100 of FIG. 1. Current sensor 404 includes at least two spaced magnetic field sensing elements 405 and a controller circuit 436. Controller circuit 436 can generate various control signals to control processing the output signals of magnetic field sensing elements 405 in order to thereby provide a current sensor output signal 428 indicative of a level of current through conductor 402. It should be appreciated that the output signals of the magnetic field sensing elements can be proportional to the current carried by conductor 402 and that the proportionality constant can be indicative of the distance between the respective magnetic field sensing elements of current sensor 404.

An input/output circuit (I/O) 438 coupled to controller 436 can control communication between current sensor 404 and various external devices or systems, such as an Engine Control Unit (ECU) in automotive applications of the current sensor system 400. For example, in some embodiments, I/O circuit 438 may include a clock (SCL) pin to receive a clock signal and a data (SDA) pin to receive and/or send a data signal. The current sensor system 400 may include a power module 440 to power circuitry within the sensor. For example, the power module 440 may include a regulator configured to receive power from a battery.

Current sensor 404 is positioned proximate to conductor 402 to sense a magnetic field generated by a current through conductor 402. To this end, current sensor 404 includes magnetic field sensing elements 405 responsive to receive a driver signal 407 from a bridge driver 406. In the example, current sensor 404 of FIG. 4, magnetic field sensing elements 405 include four magnetoresistance elements coupled in a bridge configuration, such as a Wheatstone bridge. For example, magnetoresistance elements 405 may be coupled such that each leg of the bridge includes two magnetoresistance elements positioned adjacent to one another, with one such leg spaced from the other leg. For example, magnetoresistance elements 405 may be coupled such that each leg of the bridge includes two magnetoresistance elements positioned diagonal from each other to form each respective leg of the bridge or group of elements (e.g., element in left leg upper position and element in right leg lower position form a first bridge leg and element in left leg lower position and element in right leg upper position form a second bridge).

With this arrangement, a differential output signal of the bridge (taken between intermediate nodes of each bridge leg) may result in a differential signal that rejects stray fields from sources other than the current through the conductor

402. For example, one bridge leg can provide sensing element 260 (FIG. 2A) and the other bridge leg can provide sensing element 262 (FIG. 2A) so that the resulting differential signal is indicative of the difference between the magnetic field sensed by each bridge leg. The magnetoresistance elements 405 may include at least one of at least one of an Indium Antimonide (InSb) element, a giant magnetoresistance (GMR) element, an anisotropic magnetoresistance (AMR) element, a tunneling magnetoresistance (TMR) element or a magnetic tunnel junction (MTJ) element. It should be appreciated that, in some embodiments, magnetic field sensing elements 405 may be provided as one or more Hall effect elements.

Controller circuit 436 can include or be coupled to a bridge trim circuit 408 configured to improve the accuracy of the current sensor output signal 428 by trimming the sensing elements of the bridge 405. For example, in the presence of a reference magnetic field (as may be applied during production), bridge trim circuit 408 can provide a trim signal 409 to magnetic field sensing elements 405 to trim the elements of the bridge 504 in order to thereby ensure that the sensitivity of the individual elements and/or legs of the bridge is matched.

Magnetic field sensing elements 405 can generate a differential magnetic field signal for coupling to a first differential amplifier 410. One or more outputs of first amplifier 410 are coupled to one or more inputs of an H bridge circuit 412. H bridge circuit 412 can include multiple field effect transistors coupled together to compare two input signals and remove or reduce noise and/or interference (e.g., DC offset) and in some embodiments, apply a gain to the difference between the two input signals.

A compensation coil 414 can be positioned proximate to magnetic field sensing elements 405 in order to apply an equal and opposite field to the sensing elements 405 drive the differential field on the bridge to zero Gauss. The current through coil 414 necessary to bring the differential field on the sensing elements 405 to zero is sensed by a resistor 416 in order to thereby implement a closed loop current sensing system. It should be appreciated that although current sensor 404 is shown to be a closed loop sensor in FIG. 4, in some embodiments, current sensor 404 can be an open loop sensor.

A voltage on the sense resistor 416 is coupled to further amplifiers 418 and 420 to implement offset and gain adjustment, including temperature compensation. An output terminal 428 of current sensor 404 (e.g., VOUT) can be provided at the output of amplifier 420 to provide a signal having a level indicative of the current through the conductor 402.

A differential comparator 422 can be provided to implement a fault detection feature. To this end, a logic gate 424 has a first input coupled to the output of comparator 422 and a second input coupled to an interrupt signal 425. In some embodiments, logic gate 424 may include an OR gate. An output of logic gate 424 is coupled to a control input of a transistor 426 such that detection of a current greater than a predetermined level causes a fault signal 430 to be provided. Current sensor 404 can include an analog-to-digital converter (ADC) 434 can be configured to monitor analog signals within current sensor 404 (e.g., analog references).

Figure 5:
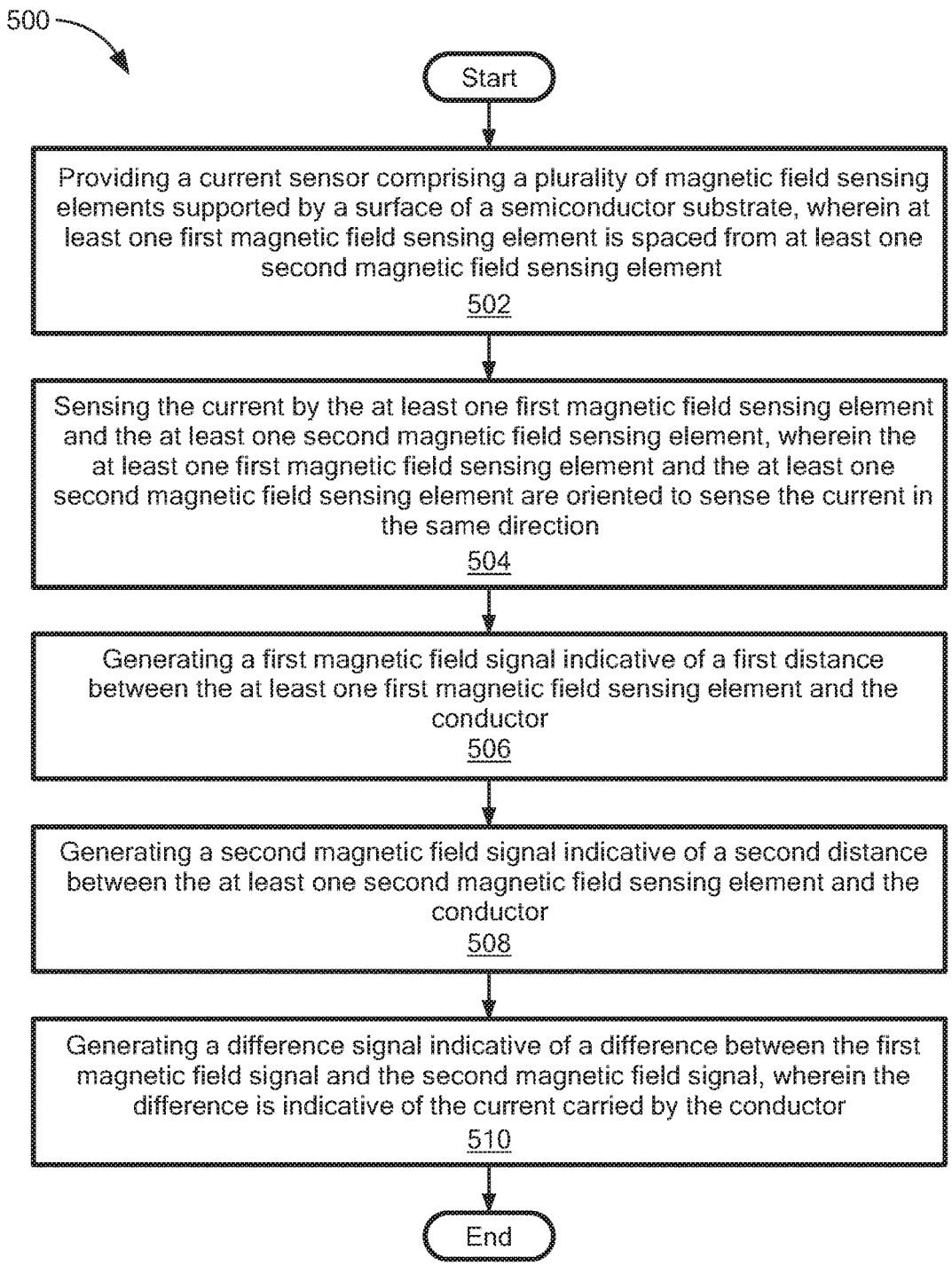
FIG. 5 is a flow diagram of a method for sensing a magnetic field generated by a current through a conductor by the current sensor of FIG. 1.

Now referring to FIG. 5, a method 500 for sensing a magnetic field generated by a current through an external conductor begins at block 502, by providing a current sensor comprising a plurality of magnetic field sensing elements supported by a first surface of a substrate. At least one first magnetic field sensing element (hereinafter first magnetic field sensing element) can be spaced from at least one second magnetic field sensing element (hereinafter second magnetic field sensing element). It should be appreciated that the following description describes a current sensor having two magnetic field sensing elements, however a current sensor as described herein may include more than two magnetic field sensing elements.

The current sensor can include a lead frame having a die attach paddle and a plurality of leads. The substrate can be coupled to the die attach paddle. The plurality of leads can include a first plurality of leads coupled to the die attach paddle and a second plurality of leads spaced from the die attach paddle. For example, the first plurality of leads can be coupled to and extend from a first side of the die attach paddle and the second plurality of leads can be spaced from a second side of the die attach paddle.

The current sensor can be positioned proximate to a current carrying external conductor (e.g., external to the current sensor) to sense a magnetic field generated by the current through the conductor. The first plurality of leads may be coupled to a non-current carrying surface and the second plurality of leads may be coupled to the current carrying conductor. The second plurality of leads are spaced from the die attach paddle, thus, the die attach paddle may be isolated from the current carrying conductor.

One or more cutouts may be formed in the die attach paddle. The one or more cutouts can be formed such that they are aligned with at least one magnetic field sensing element. For example, in one embodiment, the one or more slots may be formed such that each of them are under at least one magnetic field sensing element.

In some embodiments, one or more slits may be formed in the conductor. Slits in the conductor may be aligned substantially with a direction of the current flow. For example, in some embodiments, the slits can be formed such that they are generally parallel with a direction of the current. In some embodiments having multiple slits, the slits may be formed such that they are spaced equidistant from each other. In other embodiments having multiple slits, the slits may be formed such that they are spaced at varying distances from a first slit to a next adjacent slit.

The current sensor may be formed having a downset configuration. For example, the plurality of leads can be positioned at a first height with respect to the conductor and the die attach paddle can be positioned at a second height with respect to the conductor. The first height can be greater than the second height such that the die attach paddle, substrate and plurality of magnetic field sensing elements are disposed at a lower height and in a closer proximity to the current carrying conductor than otherwise possible.

In some embodiments, a mold material may enclose the die attach paddle, a portion of the plurality of leads, and the substrate to form a current sensor package. The first plurality of the leads can extend from a first side of mold material and the second plurality of the leads can extend from a second, opposite side of the mold material.

At block 504, the current though the external conductor can be sensed by the first magnetic field sensing element and the second magnetic field sensing element. The current sensor can be positioned such that the first magnetic field sensing element is vertically aligned with the current carrying conductor and the second magnetic field sensing element is not vertically aligned with the conductor and instead is positioned over a non-current carrying surface. However, both the first magnetic field sensing element and the second magnetic field sensing element can be oriented such that they sense the current in the same direction.

At block 506, a first magnetic field signal indicative of a first distance between the first magnetic field sensing element and the conductor is generated. The first magnetic field sensing element can be configured to generate the first magnetic field signal based at least in part on a distance between the first magnetic field sensing element and the conductor.

At block 508, a second magnetic field signal indicative of a second distance between the second magnetic field sensing element and the conductor. The second magnetic field sensing element can be configured to generate the second magnetic field signal based at least in part on a distance between the second magnetic field sensing element and the conductor. In an embodiment, the first and second magnetic field signals can be proportional to the current carried by the conductor and that the proportionality constant can be indicative of the distance between the respective magnetic field sensing elements.

The first and second magnetic field sensing elements are positioned at different distances from the conductor and thus the first magnetic field signal and the second magnetic field signal can be generated at different levels based on a difference in their respective distance from the conductor. For example, and as discussed above, the first magnetic field sensing element can be positioned over the conductor and the second magnetic field sensing element can be positioned such that it is not over the conductor, thus the first magnetic field signal may be at a first level and the second magnetic field signal may be at a second, different level.

At block 510, a difference signal can be generated indicative of a difference between the first magnetic field signal and the second magnetic field signal. In an embodiment, the difference signal can be indicative of the current carried by the conductor.

Figure 6:
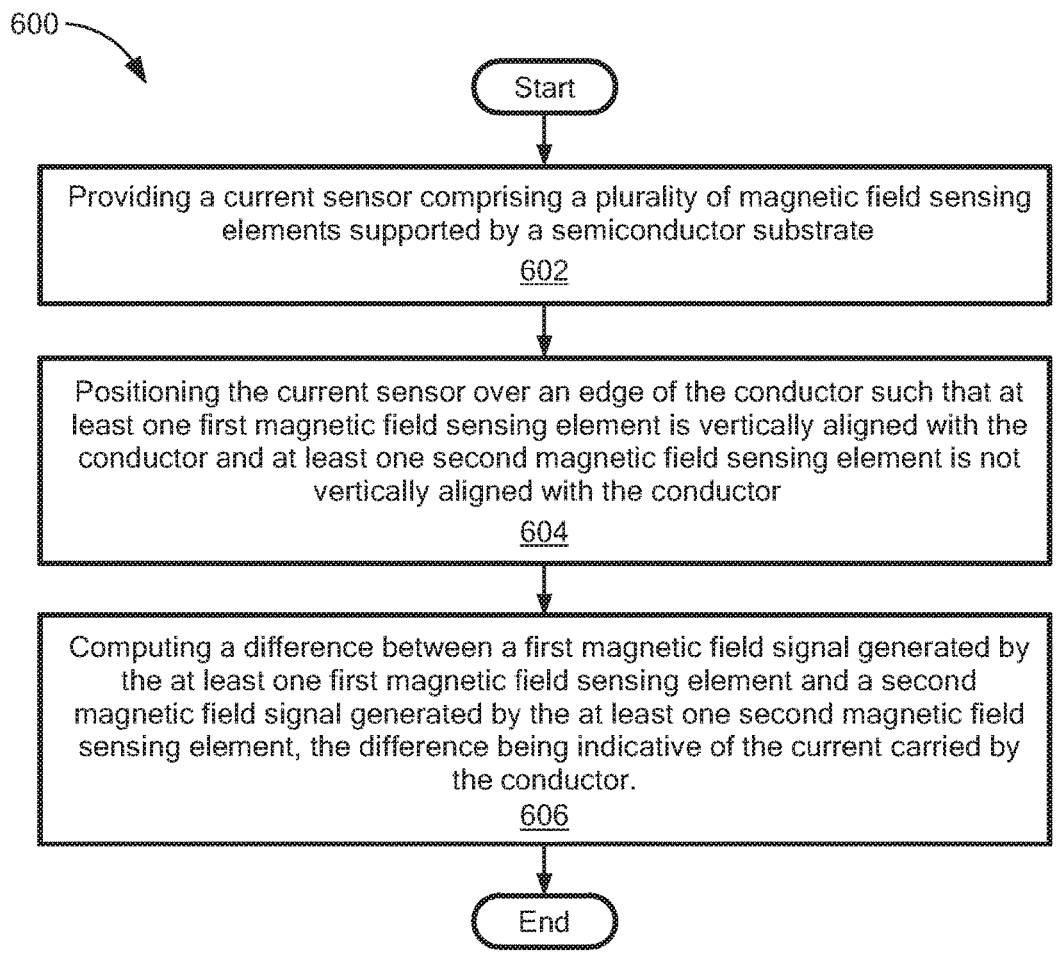
FIG. 6 is a flow diagram of a method for sensing a magnetic field generated by a current though a conductor by the current sensor of FIG. 1.

Now referring to FIG. 6, a method 600 for sensing a magnetic field generated by a current through a conductor begins at block 602 by providing a current sensor comprising a plurality of magnetic field sensing elements. A first magnetic field sensing element can be spaced from a second magnetic field sensing element within the current sensor.

The current sensor includes a lead frame having a die attach paddle and a plurality of leads. The substrate can be coupled to the die attach paddle. The plurality of leads can include a first plurality of leads coupled to the die attach paddle and a second plurality of leads spaced from the die attach paddle. For example, the first plurality of leads can be coupled to and extend from a first side of the die attach paddle and the second plurality of leads can be spaced from a second side of the die attach paddle.

At block 604, the current sensor can be positioned over an edge of the conductor such that at least one first magnetic field sensing element is vertically aligned with the conductor and at least one second magnetic field sensing element is not vertically aligned with the conductor. With this configuration, the first and second magnetic field elements will experience a different magnetic field strength as a result of the field generated by the current through the conductor and the difference between these sensed magnetic fields can be used to detect the current level.

At block 606, a difference between a first magnetic field signal generated by the at least one first magnetic field sensing element and a second magnetic field signal generated by the at least one second magnetic field sensing element can be computed. The difference can be indicative of the current carried by the conductor.

Figure 7A:
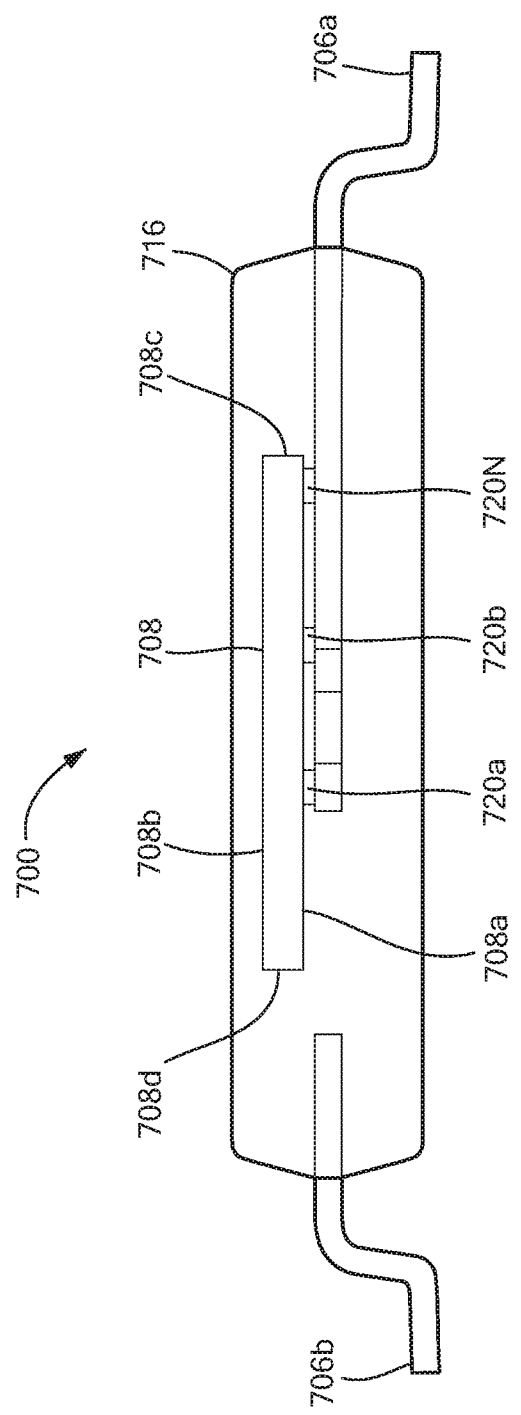
FIG. 7A shows a side view of the flip chip current sensor of FIG. 7.

Now referring to FIGS. 7-7A, a current sensor 700 includes a lead frame 702, a substrate 708 and a plurality of magnetic field sensing elements 710a-710n supported by substrate 708. Lead frame 702 includes a first plurality of leads 706a and a second plurality of leads 706b. Substrate 708 includes a first surface 708a positioned proximate to leads 706a, 706b and a second surface 708b positioned distal from leads 706a, 706b. In the illustrative embodiment of FIG. 7, current sensor 700 is provided having a flip chip arrangement. For example, plurality of magnetic field sensing elements 710a-710n are supported by the first surface 708a of substrate 708 and thus proximate to leads 706a, 706b.

In an embodiment, current sensor 700 can be positioned over an edge of an external conductor (FIG. 2) and be configured to perform current sensing based at least in part on a relative spacing between each of the at least two of the magnetic field sensing elements 710a-710n and the conductor. Lead frame 702 can be configured to provide high voltage isolation between signal leads as may carry relatively low voltage signals and high voltage leads as may contact an external conductor. For example, first plurality of leads 706a can extend from a first side 708c of substrate 708 and second plurality of leads 706b can be spaced from (e.g., not in contact with) a second side 708d of substrate 708. Leads 706a may be coupled to a non-current carrying surface and leads 706b may be coupled to a current carrying surface of a conductor.

For example, in some embodiments, leads 706a may be coupled to a microcontroller or other surface that may utilize low voltage current measurement signals. It should be appreciated that a non-current carrying surface as referred to herein may refer to a low voltage surface or a surface carry a current less than a current carrying surface of a conductor (e.g., conductor 206 of FIG. 2.). Thus, leads 706b (coupled to current carrying conductor) may be electrically isolated from substrate 708.

As illustrated in FIG. 7A, a plurality of solder bumps 720a, 720b may be disposed between substrate 708 and first plurality of leads 706a. Second plurality of leads 706b are spaced from second side 708d of substrate 708. In an embodiment, one or more solder bumps 720a-720n may be disposed on one or more of first plurality of leads 706a to couple substrate 708 to first plurality of leads 706a. It should be appreciated that, in some embodiments, current sensor 700 having a flip chip configuration may include a die attach (not shown).

A mold material 716 may enclose the substrate 708 and a portion of first and second plurality of leads 706a, 706b to form a current sensor package. First plurality of the leads 706a can extend from a first side of mold material 716 and second plurality of the leads 706b can extend from a second, opposite side of the mold material 716.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A current sensor for sensing a magnetic field generated by a current through an external conductor comprising:
    a lead frame having a first surface and a second, opposing surface, the lead frame comprising a plurality of leads;
    one or more substrates attached to the lead frame;
    a plurality of magnetic field sensing elements supported by the one or more substrates, wherein at least one first magnetic field sensing element of the plurality of magnetic field sensing elements is spaced from at least one second magnetic field sensing element of the plurality of magnetic field sensing elements, wherein the at least one first magnetic field sensing element and the at least one second magnetic field sensing element are orientated to sense the magnetic field in the same direction, wherein the at least one first magnetic field sensing element is configured to generate a first magnetic field signal indicative of a first distance between the at least one first magnetic field sensing element and an edge of the conductor and wherein the at least one second magnetic field sensing element is configured to generate a second magnetic field signal indicative of a second distance between the at least one second magnetic field sensing element and the edge of the conductor, wherein the first distance and the second distance are different distances; and a circuit responsive to the first magnetic field signal and to the second magnetic field signal and configured to generate a difference signal indicative of a difference between the first magnetic field signal and the second magnetic field signal, wherein the difference is indicative of the current carried by the conductor.

2. The current sensor of claim 1, wherein the lead frame further comprises a die attach paddle and the one or more substrates are attached to the die attach paddle.

3. The current sensor of claim 2, wherein the one or more substrates have a first surface attached to the die attach paddle and a second, opposing surface, and wherein the plurality of magnetic field sensing elements are supported by the second surface of the one or more substrates.

4. The current sensor of claim 1, wherein the one or more substrates have a first surface attached to one or more of the plurality of leads, and a second, opposing surface distal from the lead frame, and wherein the plurality of magnetic field sensing elements are supported by the first surface of the one or more substrates.

5. The current sensor of claim 1, wherein the at least one first magnetic field sensing element is vertically aligned with the external conductor and the at least one second magnetic field sensing element is not vertically aligned with the external conductor.

6. The current sensor of claim 2, wherein the die attach paddle comprises one or more slits, slots or apertures.

7. The current sensor of claim 2, wherein the plurality of leads are disposed at a first height with respect to the external conductor and the die attach paddle is disposed at a second height with respect to the external conductor, wherein the first height is different from and greater than the second height.

8. The current sensor of claim 2, further comprising a mold material enclosing the one or more substrates and a portion of the lead frame including the die attach paddle, and wherein a first plurality of the leads extend from a first side of the mold material and a second plurality of the leads extend from a second, opposite side of the mold material, and wherein the die attach paddle is attached to one or more of the first plurality of the leads and is spaced from the second plurality of leads.

9. The current sensor of claim 1, wherein the plurality of magnetic field sensing elements comprises at least one of a Hall effect element or a magnetoresistance element.

10. The current sensor of claim 9, wherein the magnetoresistance element comprises at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

11. A current sensor for sensing a magnetic field generated by a current through an external conductor comprising:
a lead frame having a first surface and a second, opposing surface, a die attach paddle, a first plurality of leads and a second plurality of leads, the die attach paddle having first side adjacent to the first plurality of leads and second, opposing side adjacent to the second plurality of leads, wherein the first side of the die attach paddle is attached to at least one of the first plurality of leads and wherein the second side of the die attach paddle is spaced apart and electrically isolated from the second plurality of leads;
one or more substrates attached to the die attach paddle; and
a plurality of magnetic field sensing elements supported by the one or more substrates, wherein at least one first magnetic field sensing element of the plurality of magnetic field sensing elements is spaced from at least one second magnetic field sensing element of the plurality of magnetic field sensing elements such that the at least one first magnetic field sensing element is closer to the first side of the die attach paddle than to the second side of the die attach paddle and the at least one second magnetic field sensing element is closer to the second side of the die attach paddle than to the first side of the die attach paddle.

12. The current sensor of claim 11, wherein the one or more substrates have a first surface attached to the die attach paddle and a second, opposing surface, and wherein the plurality of magnetic field sensing elements are supported by the second surface of the one or more substrates.

13. The current sensor of claim 11, wherein the at least one first magnetic field sensing element is configured to generate a first magnetic field signal indicative of a distance between the at least one first magnetic field sensing element and the conductor and wherein the at least one second magnetic field sensing element is configured to generate a second magnetic field signal indicative of a distance between the at least one second magnetic field sensing element and the conductor, and wherein the current sensor further comprises a circuit responsive to the first magnetic field signal and to the second magnetic field signal and configured to generate a difference signal indicative of a difference between the first magnetic field signal and the second magnetic field signal, wherein the difference is indicative of the current carried by the conductor.

14. The current sensor of claim 11, wherein the at least one first magnetic field sensing element is vertically aligned with the conductor and the at least one second magnetic field sensing element is not vertically aligned with the conductor.

15. The current sensor of claim 11, wherein the die attach paddle comprises one or more slits, slots or apertures.

16. The current sensor of claim 11, wherein the first and second plurality of leads are disposed at a first height with respect to the conductor and the die attach paddle is disposed at a second height with respect to the conductor, wherein the first height is different from and greater than the second height.

17. The current sensor of claim 11, further comprising a mold material enclosing the one or more substrates and a portion of the lead frame including the die attach paddle, and wherein the first plurality of the leads extends from a first side of mold material and the second plurality of the leads extends from a second, opposite side of the mold material.

18. The current sensor of claim 11, wherein the plurality of magnetic field sensing elements comprises at least one of a Hall effect element or a magnetoresistance element.

19. The current sensor of claim 18, wherein the magnetoresistance element comprises at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

20. A method for sensing a magnetic field generated by a current through an external conductor, the method comprising:
providing a lead frame having a first surface and a second, opposing surface, the lead frame comprising a die attach paddle and a plurality of leads, wherein one or more substrates are attached to the die attach paddle;
providing a current sensor comprising a plurality of magnetic field sensing elements supported by a surface of the one or more substrates, wherein at least one first magnetic field sensing element of the plurality of magnetic field sensing elements is spaced from at least one second magnetic field sensing element of the plurality of magnetic field sensing elements;
sensing the magnetic field by the at least one first magnetic field sensing element and the at least one second magnetic field sensing element, wherein the at least one first magnetic field sensing element and the at least one second magnetic field sensing element are orientated to sense the magnetic field in the same direction;
generating a first magnetic field signal indicative of a first distance between the at least one first magnetic field sensing element and an edge of the conductor;
generating a second magnetic field signal indicative of a second distance between the at least one second magnetic field sensing element and the edge of the conductor, wherein the second distance is different than the first distance; and
generating a difference signal indicative of a difference between the first magnetic field signal and the second magnetic field signal, wherein the difference is indicative of the current carried by the conductor.

21. The method of claim 20, further comprising positioning the at least one first magnetic field sensing element such that it is vertically aligned with the conductor and positioning the at least one second magnetic field sensing element such that it is not vertically aligned with the conductor.

22. The method of claim 20, further comprising forming one or more slits, slots or apertures in the die attach paddle.

23. The method of claim 20, further comprising disposing the plurality of leads at a first height with respect to the conductor and disposing the die attach paddle at a second height with respect to the conductor, wherein the first height is different from and greater than the second height.

24. The method of claim 20, further comprising enclosing the one or more substrates and a portion of the lead frame including the die attach paddle in a mold material, and wherein a first plurality of the leads extends from a first side of mold material and a second plurality of the leads extends from a second, opposite side of the mold material, and wherein the die attach paddle is attached to one or more of the first plurality of the leads and is spaced from the second plurality of leads.

25. The method of claim 20, wherein the plurality of magnetic field sensing elements comprises at least one of a Hall effect element or a magnetoresistance element.

26. The method of claim 25, wherein the magnetoresistance element comprises at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

27. A current sensor for sensing a magnetic field generated by a current through an external conductor, the magnetic field having a direction associated with a direction of the current through the conductor, comprising:
first means for sensing the magnetic field generated by the current to generate a first magnetic field signal indicative of a first distance between the first magnetic field sensing means and an edge of the conductor;
second means for sensing the magnetic field generated by the current to generate a second magnetic field signal indicative of a second distance between the second magnetic field sensing means and the edge of the conductor, wherein the second distance is different than the first distance;
means for supporting the first magnetic field sensing means and the second magnetic field sensing means in a spaced relationship, but with both the first and second magnetic field sensing means oriented to sense the magnetic field in the same direction; and
means for determining a difference between the first magnetic field signal and the second magnetic field signal, wherein the difference is indicative of the current through the conductor.

28. The current sensor of claim 27, wherein the first magnetic field sensing means is vertically aligned with the external conductor and the second magnetic field sensing means is not vertically aligned with the external conductor.

* * * * *

UNITED STATES PATENT AND TRADEMARK OFFICE
CERTIFICATE OF CORRECTION

PATENT NO. : 10,481,181 B2
APPLICATION NO. : 15/496152
DATED : November 19, 2019
INVENTOR(S) : Wade Bussing et al.

Page 1 of 1

It is certified that error appears in the above-identified patent and that said Letters Patent is hereby corrected as shown below:

In the Specification

Column 2, Line 32 delete "conductor, than" and replace with --conductor than--.

Column 6, Line 43 delete "is it" and replace with --is--.

Column 9, Line 58 delete "carry" and replace with --carrying--.

Column 18, Line 31 delete "carry" and replace with --carrying--.

Signed and Sealed this
Eighteenth Day of August, 2020

Andrei Iancu
*Director of the United States Patent and Trademark Office*